US012184017B2

(12) United States Patent
Hatol et al.

(10) Patent No.: US 12,184,017 B2
(45) Date of Patent: Dec. 31, 2024

(54) BUS BAR ASSEMBLY

(71) Applicant: AES Global Holdings PTE Ltd., Singapore (SG)

(72) Inventors: Angelito Hatol, Antipolo (PH); Romano Iniego, Quezon (PH)

(73) Assignee: AES Global Holdings PTE Ltd., Singapore (SG)

( * ) Notice: Subject to any disclaimer, the term of this patent is extended or adjusted under 35 U.S.C. 154(b) by 741 days.

(21) Appl. No.: 17/334,934

(22) Filed: May 31, 2021

(65) Prior Publication Data

US 2022/0385014 A1 Dec. 1, 2022

(51) Int. Cl.
| *H01R 25/16* | (2006.01) |
| *H01R 12/70* | (2011.01) |
| *H01R 12/71* | (2011.01) |
| *H01R 25/00* | (2006.01) |
| *H02G 5/00* | (2006.01) |

(52) U.S. Cl.
CPC ....... *H01R 25/162* (2013.01); *H01R 12/7047* (2013.01); *H01R 12/7088* (2013.01); *H01R 12/718* (2013.01); *H01R 25/006* (2013.01); *H02G 5/005* (2013.01)

(58) Field of Classification Search
CPC .............. H01R 25/162; H01R 12/7047; H01R 12/7088; H01R 12/718; H01R 25/006; H02G 5/005; H05K 7/1457; H05K 7/1492
See application file for complete search history.

(56) References Cited

U.S. PATENT DOCUMENTS

| 5,422,440 | A | * | 6/1995 | Palma ................ H05K 7/14329 |
| | | | | 174/70 B |
| 5,672,070 | A | * | 9/1997 | Weiss ................... H01R 25/162 |
| | | | | 439/213 |
| 6,024,589 | A | * | 2/2000 | Hahn, IV ............... H05K 1/148 |
| | | | | 439/212 |
| 6,603,075 | B1 | * | 8/2003 | Soares ..................... H02B 1/21 |
| | | | | 174/70 B |
| 9,166,309 | B1 | * | 10/2015 | Costello ............. H01R 9/2675 |
| D867,300 | S | | 11/2019 | Huang |
| 2016/0308455 | A1 | * | 10/2016 | Ratadiya .................. H02K 3/51 |

(Continued)

FOREIGN PATENT DOCUMENTS

| CN | 207967527 U | 10/2018 |
| EP | 3461246 A2 | 3/2019 |

(Continued)

*Primary Examiner* — Steven T Sawyer

(57) ABSTRACT

A bus bar assembly comprises a first bus bar and a second bus bar. Each bus bar comprises a bridge flange having a first side and a second side, top and bottom flanges extending from the first side of the bridge flange, and an interface flange extending from the second side of the bridge flange. The bus bar assembly further comprises a first insulation layer positioned between the top flanges of the first and second bus bars and a second insulation layer positioned between the bottom flanges of the first and second bus bars. Each of the top and bottom flanges comprises a plurality of mating devices coupled thereto. The top flanges of the first and second bus bars and the first insulation layer are fixedly joined together. The bottom flanges of the first and second bus bars and the second insulation layer are fixedly joined together.

15 Claims, 10 Drawing Sheets

(56) References Cited

U.S. PATENT DOCUMENTS

2018/0048127 A1\* 2/2018 Liang ................ H02B 1/20
2019/0074667 A1\* 3/2019 Huang ............... H02B 1/48

FOREIGN PATENT DOCUMENTS

| ES | 2728718 A1 | 10/2019 |
| FR | 2445093 A1 | 7/1980 |
| KR | 20140061930 A | 5/2014 |

\* cited by examiner

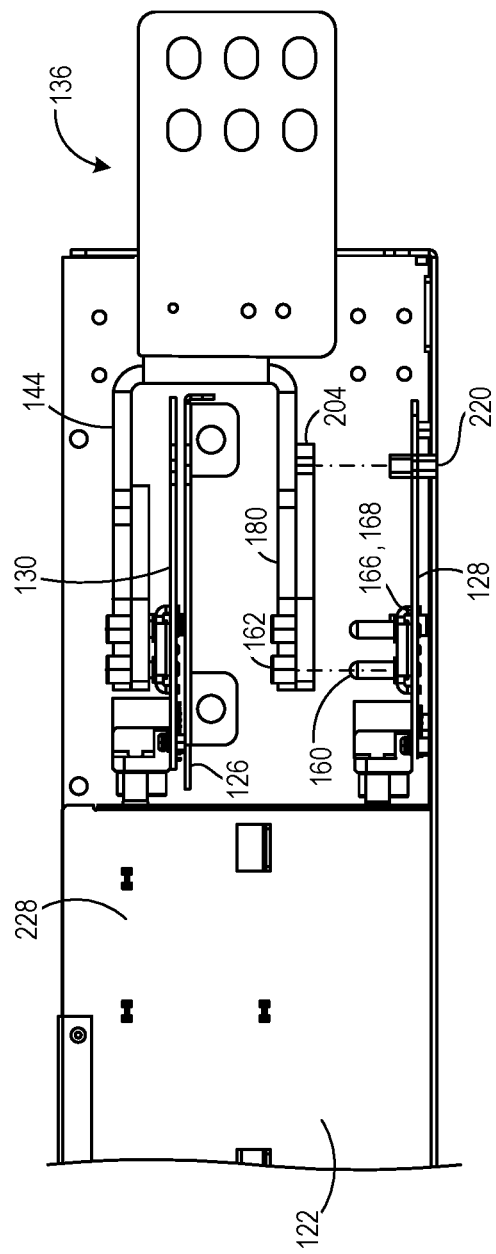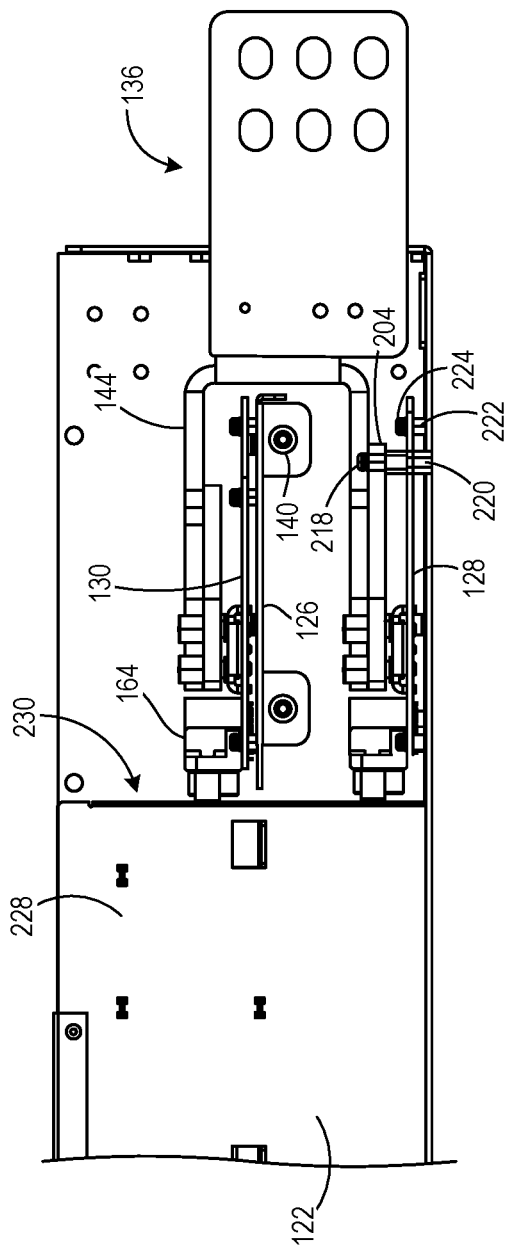

BUS BAR ASSEMBLY

TECHNICAL FIELD

Aspects of the disclosure relate to output power distribution, and more particularly to power delivery to a rack mount system from a plurality of power supplies via a bus bar assembly.

BACKGROUND

It is well known to use equipment racks for mounting and supporting multiple equipment modules. For example, racks are widely used in modern data centers, ISP facilities and corporate server rooms for mounting and supporting various equipment modules, including computing, telecommunication, audio, and/or video equipment. Generally, the equipment rack is connected to an AC or DC power source, and the equipment rack converts the input power (e.g., AC or DC) to required DC output power for the equipment installed in the rack via power supply units (PSUs).

In general, the rack mountable equipment or product (e.g., network switch, server, data storage system, etc.) is designed without an integral power supply. Instead, the product is powered by a central power distribution system (PDS) of the rack. The product is electrically connected to the PDS via bus bars (e.g., a 48V or 12V DC bus bar and a ground bus bar) located along the rear of the rack. The product may be electrically connected to the rack bus bars in order to input the bus bar voltage to power the product.

A power shelf within the rack mount system can include a number of power supplies to convert AC power into DC power for the PDS. The power requirements for a rack setup can vary according to the voltage load requirements of the equipment/components installed in the rack. Further, each shelf or row of the equipment rack can have a fixed width such as 19 inches, 21 inches, or the like. Accordingly, the number of power supplies in any given row of a power shelf is limited by the sizes of the power supplies and the width of the row.

The power requirement for a given equipment arrangement in an equipment rack may have a need for the number of power supplies providing power to the PDS to exceed the number of power supplies capable of fitting in a single row of the rack. For example, two or more rows of power supplies may be installed in the rack to satisfy power demands of the equipment to be installed in the rack.

OVERVIEW

In accordance with one aspect of the present disclosure, a bus bar assembly comprises a first bus bar and a second bus bar, each of the first bus bar and the second bus bar respectively comprises a bridge flange having a first side and a second side opposite the first side, a top flange extending from the first side of the bridge flange and comprising a first plurality of mating devices coupled thereto, a bottom flange extending from the first side of the bridge flange and comprising a second plurality of mating devices coupled thereto, and an interface flange extending from the second side of the bridge flange. The bus bar assembly further comprises a first insulation layer positioned between the top flange of the first bus bar and the top flange of the second bus bar and a second insulation layer positioned between the bottom flange of the first bus bar and the bottom flange of the second bus bar. The top flange of the first bus bar, the top flange of the second bus bar, and the first insulation layer are fixedly joined together. The bottom flange of the first bus bar, the bottom flange of the second bus bar, and the second insulation layer are fixedly joined together.

In accordance with another aspect of the present disclosure, a power shelf for an equipment rack comprises a chassis and a plurality of power supply units (PSUs) comprising a first PSU positioned within a first row of the chassis and a second PSU positioned within a second row of the chassis. A first printed circuit board (PCB) is coupled to the first PSU, and a second PCB is coupled to the second PSU. A bus bar assembly comprises a first bus bar comprising a first bridge flange, a first flange extending from a first side of the first bridge flange, a second flange extending from the first side of the first bridge flange, and a first system interface flange extending from a second side of the first bridge flange. A second bus bar comprises a second bridge flange, a third flange extending from a first side of the second bridge flange, a fourth flange extending from the first side of the second bridge flange, a second system interface flange extending from a second side of the second bridge flange. A first insulation layer is fixedly joined between the first flange and the third flange, and a second insulation layer is fixedly joined between the second flange and the fourth flange. The first and third bridge flanges are electrically and mechanically coupled to the first PCB. The second and fourth flanges are electrically and mechanically coupled to the second PCB.

BRIEF DESCRIPTION OF THE DRAWINGS

The drawings illustrate embodiments presently contemplated for carrying out the invention.

In the drawings:

FIGS. 9-15 illustrate steps for installing a bus bar assembly and PCBs into a power shelf chassis according to embodiments of the disclosure.

Figure 1:
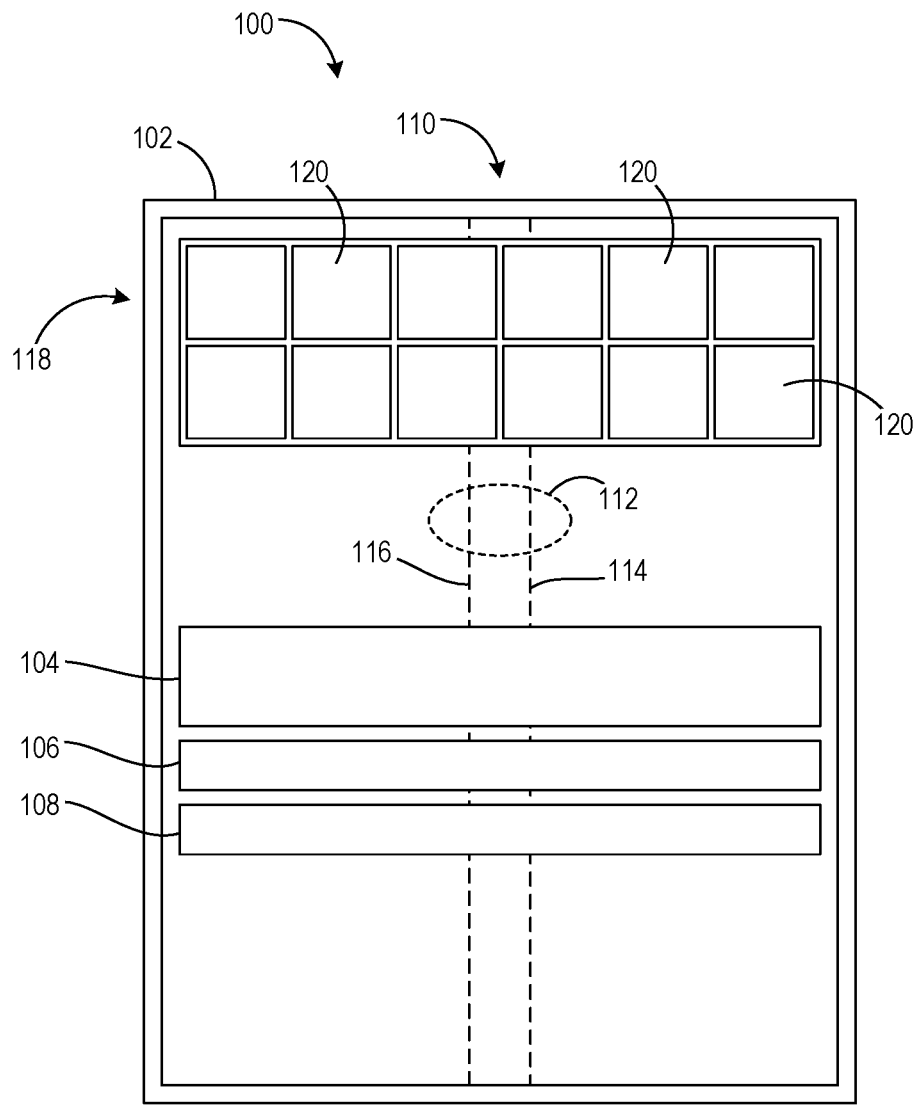
FIG. 1 illustrates a block diagram of an equipment rack according to an embodiment.

While the present disclosure is susceptible to various modifications and alternative forms, specific embodiments thereof have been shown by way of example in the drawings and are herein described in detail. It should be understood, however, that the description herein of specific embodiments is not intended to limit the present disclosure to the particular forms disclosed, but on the contrary, the intention is to cover all modifications, equivalents, and alternatives falling within the spirit and scope of the present disclosure. Note

DETAILED DESCRIPTION

Examples of the present disclosure will now be described more fully with reference to the accompanying drawings. The following description is merely exemplary in nature and is not intended to limit the present disclosure, application, or uses.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Although the disclosure hereof is detailed and exact to enable those skilled in the art to practice the invention, the physical embodiments herein disclosed merely exemplify the invention which may be embodied in other specific structures. While the preferred embodiment has been described, the details may be changed without departing from the invention, which is defined by the claims.

FIG. 1 illustrates a block diagram of an equipment rack 100 according to an embodiment. Equipment rack 100 includes an enclosure 102 capable of housing and supporting multiple pieces of equipment 104, 106, 108 such as computing, telecommunication, audio, and/or video equipment and the like. The enclosure 102 may be configured to accept specific sizes of equipment in designated locations or may be configured to allow the installation of equipment at any of various vertical positions to accommodate multiple equipment layouts.

The energy to power the equipment 104, 106, 108 is provided by a central power distribution system (PDS) 110 of the rack. PDS 110 includes a rack bus system 112 having two or more power rails 114, 116 generally located at the rear of the enclosure 102 for providing power into the rear of each piece of equipment 104, 106, 108. In one embodiment, the rack bus system 112 can be a DC power system providing a neutral power rail 114 and a voltage rail 116 having a positive or negative voltage with respect to the neutral power rail 114.

The PDS 110 receives power from one or more power shelves 118 having a plurality of power supply units (PSUs) 120 configured to receive AC or DC power and convert the received power to a DC output power for powering the equipment 104, 106, 108. As illustrated in FIG. 1, the plurality of PSUs 120 may be arranged in a multi-column, multi-row format. As described herein, the voltage outputs of the plurality of PSUs 120 are coupled together and tied to the PDS 110 to provide a desired power to the PDS 110. For example, the PDS 110 may be designed to receive a desired power from the one or more power shelves 118 (e.g., 15 kW power) with a target DC system voltage (e.g., 12V DC). Accordingly, a number of PSUs 120, each providing a portion of the total desired power, are installed in the power shelf 118 and coupled together to provide the desired power. The number of PSUs 120 to be installed can depend on the output capacity of each PSU 120. In a scenario where each PSU 120 is designed to output 1,250 A of current at 12V DC, a total of twelve PSUs 120, as illustrated, are installed in the power shelf 118 to yield a total output power of 15 kW. However, the number of PSUs 120 installed in the power shelf 118 may be more or fewer than that illustrated based on the capability of the PSUs 120 to provide a different power output. Due to a width constraint of the enclosure 102, the PSUs 120 may not be able to fit along a single row of the equipment rack 100. Thus, multiple rows of PSUs 120 can be installed in the power shelf 118 to provide the desired rack power.

Figure 2:
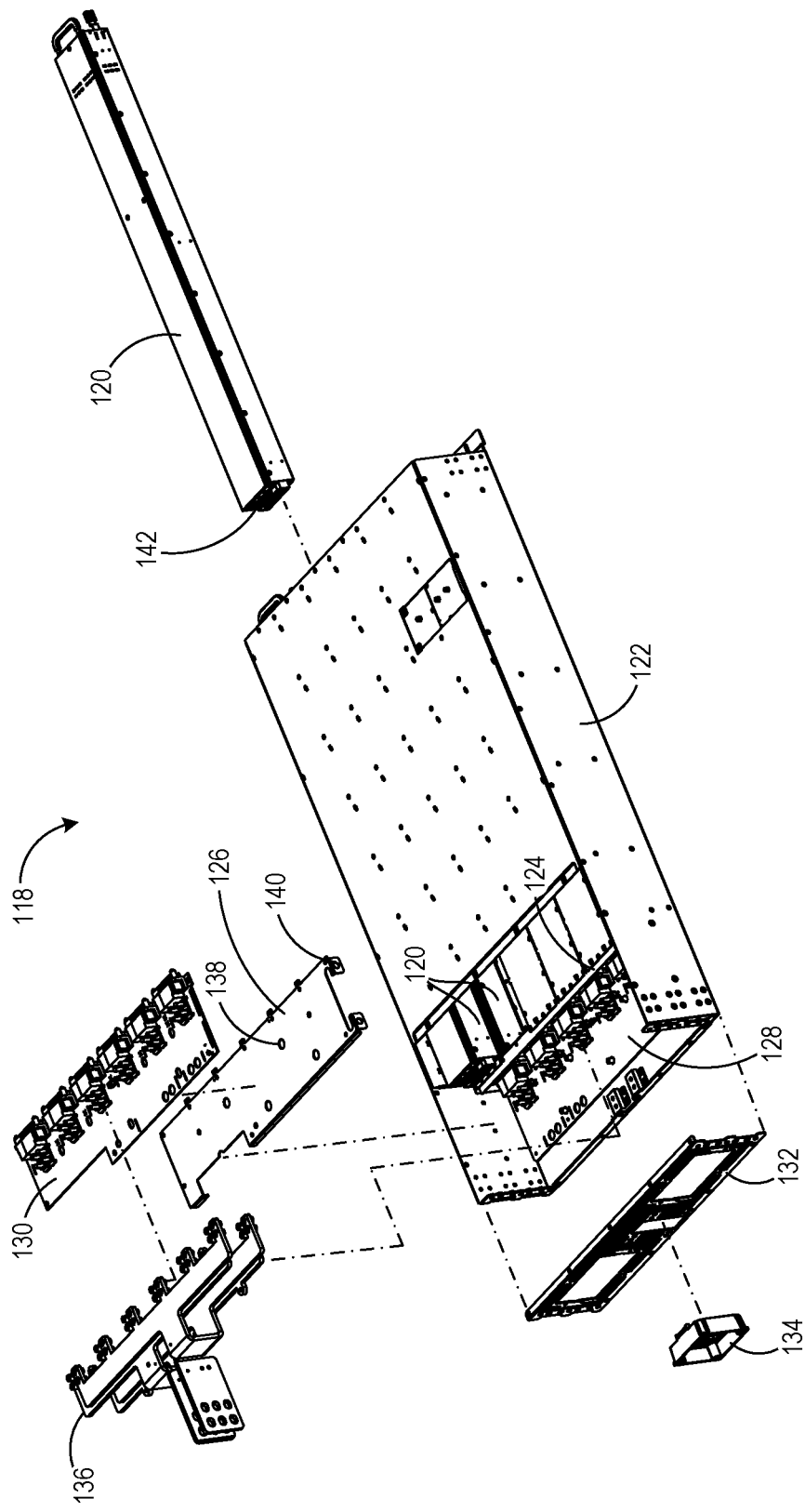
FIG. 2 illustrates an exploded view showing a portion of a multiple row power distribution shelf according to an embodiment.
Figure 12:
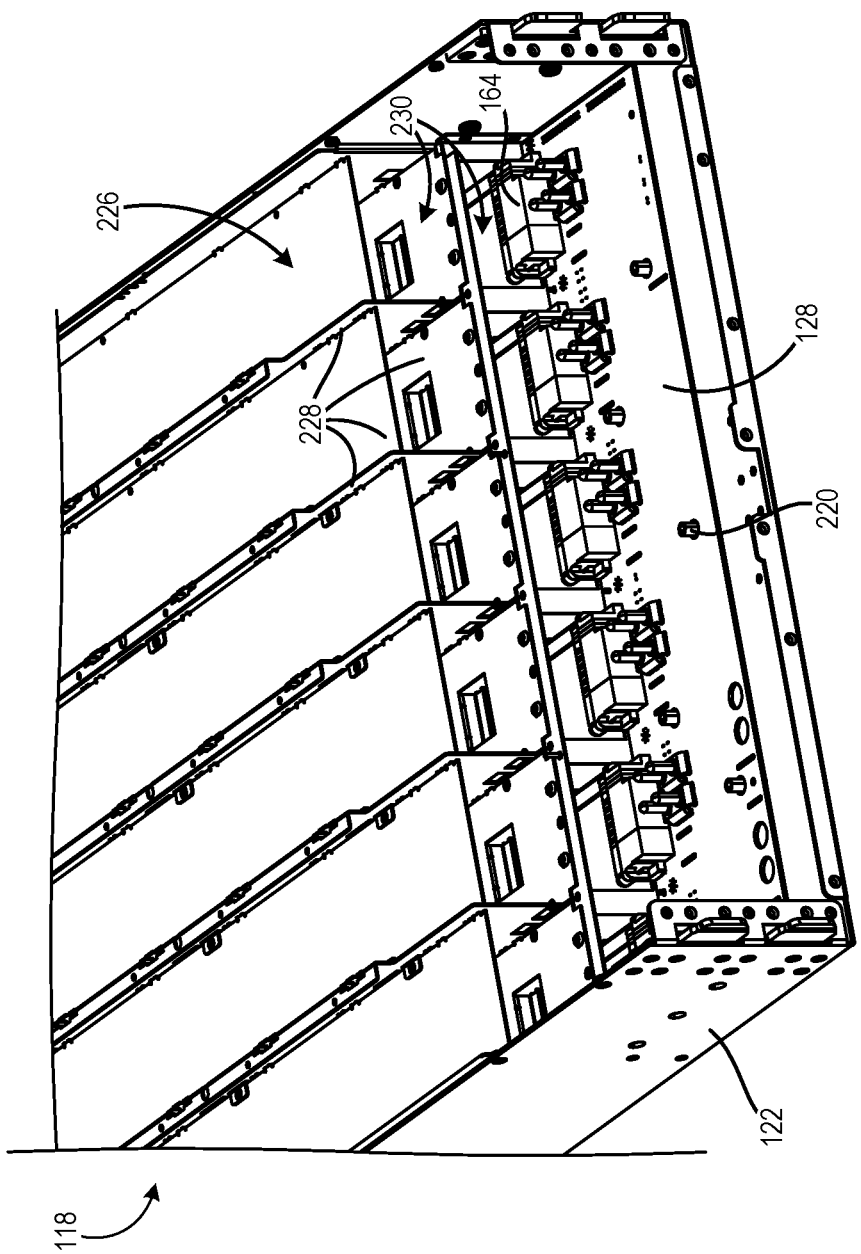

FIG. 2 illustrates an exploded view showing a portion of the multi-row power distribution shelf 118 of FIG. 1 according to an embodiment. The power shelf 118 includes a chassis 122 housing the plurality of PSUs 120 (three of which are shown in FIG. 2), a first bracket 124, a second bracket 126, a pair of printed circuit boards (PCBs) 128, 130 (one for each row of PSUs 120), a rear plate 132, a bus bar protective cover 134, and a bus bar assembly 136 coupleable to the pair of PCBs 128, 130. Additional components of the power shelf 118 are omitted to simplify the view of FIG. 2. For example, a partition assembly internal to the chassis 122 as illustrated in FIG. 12 is not shown in FIG. 2 to simplify showing the placement of the PSUs 120 within the chassis 122. The second bracket 126 includes installation holes 138, 140 to assist with securing the bus bar assembly 136 and the PCB 130 to the chassis 122.

The PSUs 120 include one or more electrical connector headers 142 that are hot-swappable and are detachably coupleable to the PCB 128 when installed in the lower, bottom row of the chassis 122 and detachably coupleable to the PCB 130 when installed in the upper, top row of the chassis 122. The PSUs 120 convert input power from an AC or DC source (not shown) into an output power compatible with the PDS 110. As stated above, each PSU 120 is configured to provide a portion of the total output power desired for the PDS 110. The output power provided by each PSU 120 is provided to the bus bar assembly 136, which transmits a combined output power based on the power output from each of the PSUs 120 and delivers the combined output power to the power rails 114, 116 of the PDS 110 for use by the equipment 104, 106, 108.

Figure 3:
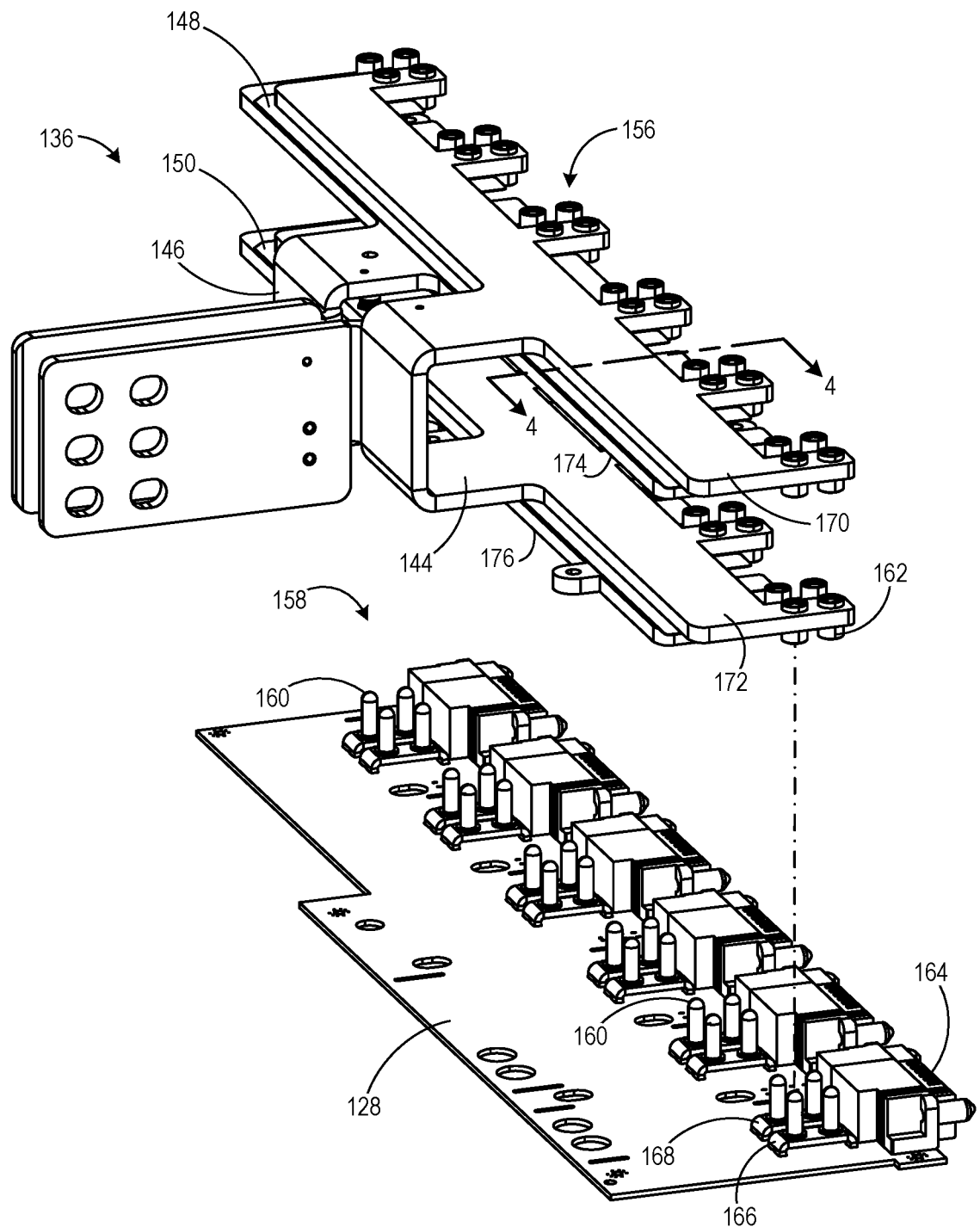
FIG. 3 illustrates an isometric plan view of a bus bar assembly and a lower PCB according to an embodiment.
Figure 4:
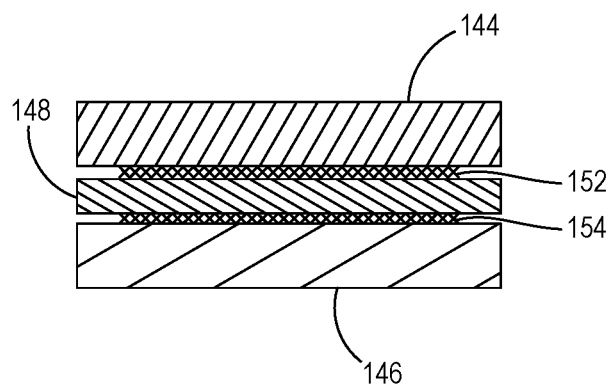
FIG. 4 illustrates a cross section view of the bus bar assembly of FIG. 3 along line 4-4 according to an embodiment.

FIG. 3 illustrates an isometric plan view of the bus bar assembly 136 and the lower PCB 128 according to an embodiment. The bus bar assembly 136 includes a first bus bar 144, a second bus bar 146, and a pair of insulation layers 148, 150 positioned between different portions of the bus bars 144, 146. In one embodiment, bus bars 144, 146 and the insulation layers 148, 150 are affixed together to form a one-piece assembly. As illustrated in FIG. 4, a cross section of the bus bar assembly 136 along line 4-4 of FIG. 3, the first bus bar 144 is coupled to the insulation layer 148 via a first adhesive layer 152, and the second bus bar 146 is coupled to the insulation layer 148 via a second adhesive layer 154. In this manner, the bus bar assembly 136 is a solid component that facilitates assembly with the PCBs 128, 130 as described hereinbelow.

The insulation layers 148, 150 electrically insulate the bus bars 144, 146 from each other. When coupled to respective power busses of the PSUs 120, the insulation layers 148, 150 act to prevent shorting between the power busses. In some embodiments, the insulation layers 148, 150 also act to thermally insulate the bus bars 144, 146 from each other. In this manner, heat transfer from one bus bar 144, 146 through the insulation layers 148, 150 may be reduced, slowed, or eliminated.

Figure 5:
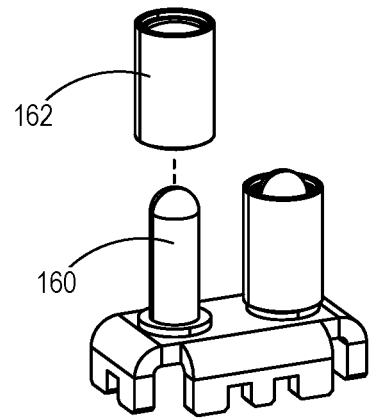
FIG. 5 illustrates electrical connectors for electrically coupling the bus bar assembly and PCBs according to an embodiment.

Returning to FIG. 3, each of the bus bars 144, 146 has a plurality of electrical connectors 156 coupled thereto to facilitate electrical connection to a plurality of electrical connectors 158 of the respective PCBs 128, 130. In one embodiment, the electrical connectors 158 include pins 160 inserted in the bus bars 144, 146 for further ease of assembly with the respective PCBs 128, 130. As illustrated, the electrical connectors 158 of the PCB 128 include sockets 162 coupled thereto that mate with the pins 160 to electrically couple the PCB 128 with the bus bars 144, 146. Referring to FIGS. 3 and 5, each pin 160 is alignable with a respective socket 162 that are electrically and mechanically coupled when mated together. The socket 162 is slidable over the pin 160 such that, when the pin 160 is aligned with and inserted in the socket 162, a mechanical friction bond is formed that electrically couples the pin 160 and the socket 162 together. While the pins 160 are illustrated as being positioned on and coupled to the PCB 128 and the sockets 162 are illustrated as being inserted and coupled to the bus bars 144, 146, embodiments contemplate that the sockets 162 may be coupled to the PCB 128 while the pins 160 may be coupled to the bus bars 144, 146. Additionally, the pins 160 and sockets 162 may be intermixed on the bus bars 144, 146 and the PCB 128 such that each bus bar 144, 146 may have both a plurality of pins 160 and a plurality of sockets 162 thereon while the PCB 128 has the corresponding mating pins 160 and sockets 162 thereon.

Further, in addition to or instead of using only the pins 160 and sockets 162 to electrically join the bus bar assembly 136 with the PCBs 128, 130, other fastening means may also be used to join the bus bar assembly 136 with the PCBs 128, 130 such as screw-type fasteners, rivets, and other removable fasteners. It may be also possible to join the bus bars 144, 146 to the PCBs 128, 130 through a soldering process if the thickness/mass of the bus bars 144, 146 permits such soldering. However, based on the electrical current/power carrying capacity required by the bus bars 144, 146, such soldering processes may require an excessive amount of heat to be applied to the PCBs 128, 130 in order to yield a successful solder joint. Such excess heat can be damaging to the PCBs 128, 130. Therefore, other non-soldering fastening means such as those described herein can avoid such heat damage.

The PCB 128 includes a PSU mating receptacle connector 164 for each PSU 120 in a single row (e.g., the bottom row) of the power shelf 118. The PCB 128 has a first pin assembly 166 and a second pin assembly 168 for each PSU mating receptacle connector 164. The first and second pin assemblies 166, 168 are electrically coupled to the PSU mating receptacle connectors 164 for further coupling to respective first and second voltage busses of the PSU 120 (FIG. 2) electrically coupled with the PSU mating receptacle connector 164. While each pin assembly 166, 168 is illustrated as having two pins 160, more or fewer pins are contemplated. The first pin assembly 166 is coupleable to the mating sockets 162 of the first bus bar 144, and the second pin assembly 168 is coupleable to the mating sockets 162 of the second bus bar 146. When connected to the first and second bus bars 144, 146, the first and second pin assemblies 166, 168 are electrically isolated from each other due, at least in part, to the insulation layers 148, 150. The first bus bar 144 has an overlapping pair of layers 170, 172, and the second bus bar 146 has an overlapping pair of layers 174, 176. Layers 172, 176 are coupleable to the first and second pin assemblies 166, 168 of the lower PCB 128, and layers 170, 174 are coupleable to the first and second pin assemblies 166, 168 of the upper PCB 130 (FIG. 14).

Figure 6:
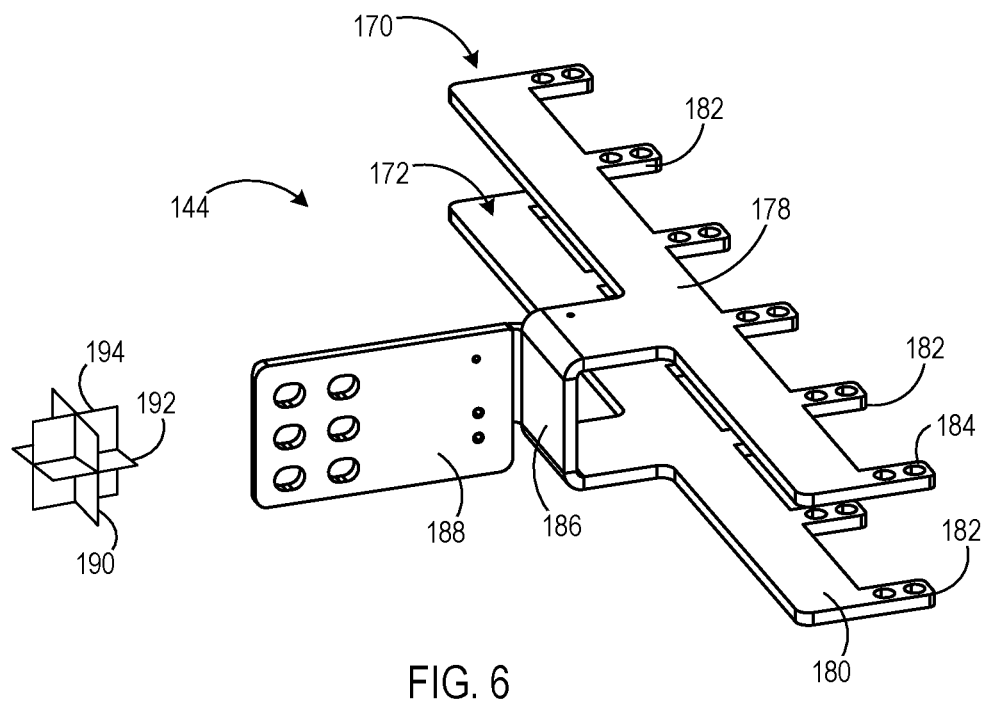
FIG. 6 illustrates an isometric view of a bus bar according to an embodiment.

FIG. 6 illustrates an isometric view of the first bus bar 144 according to an embodiment. The first bus bar 144 is formed without any fastener-assisted joints where separate bar pieces are fastened together by one or more fasteners via a lap joint, a butt joint, etc. In one embodiment, a single piece of metal such as copper or other electrically conductive metal or material preferably forms the first bus bar 144. The layer 170 of the first bus bar 144 is formed from a top flange 178, and the layer 172 is formed from a bottom flange 180. Extending from each flange 178, 180 is a plurality of tabs 182. In one embodiment, the number of tabs 182 corresponds with the number of PSUs 120 installable in a single row of the power shelf 118. As illustrated herein, six tabs 182 extend from each flange 178, 180 and correspond with the respective six PSUs 120 installable in each row of the power shelf 118. Each tab 182 has a pair of holes or apertures 184 formed therein that corresponds with the pair of sockets 162 installable thereinto as illustrated in FIG. 3 and throughout this disclosure. As stated previously, the number of installable sockets 162 may be more or fewer than two per tab 182 in other embodiments. Further, the holes 184 may accommodate installed pins 160 therein or may not be needed to be formed at all when using surface-mountable pins 160 in other embodiments.

Figure 15:
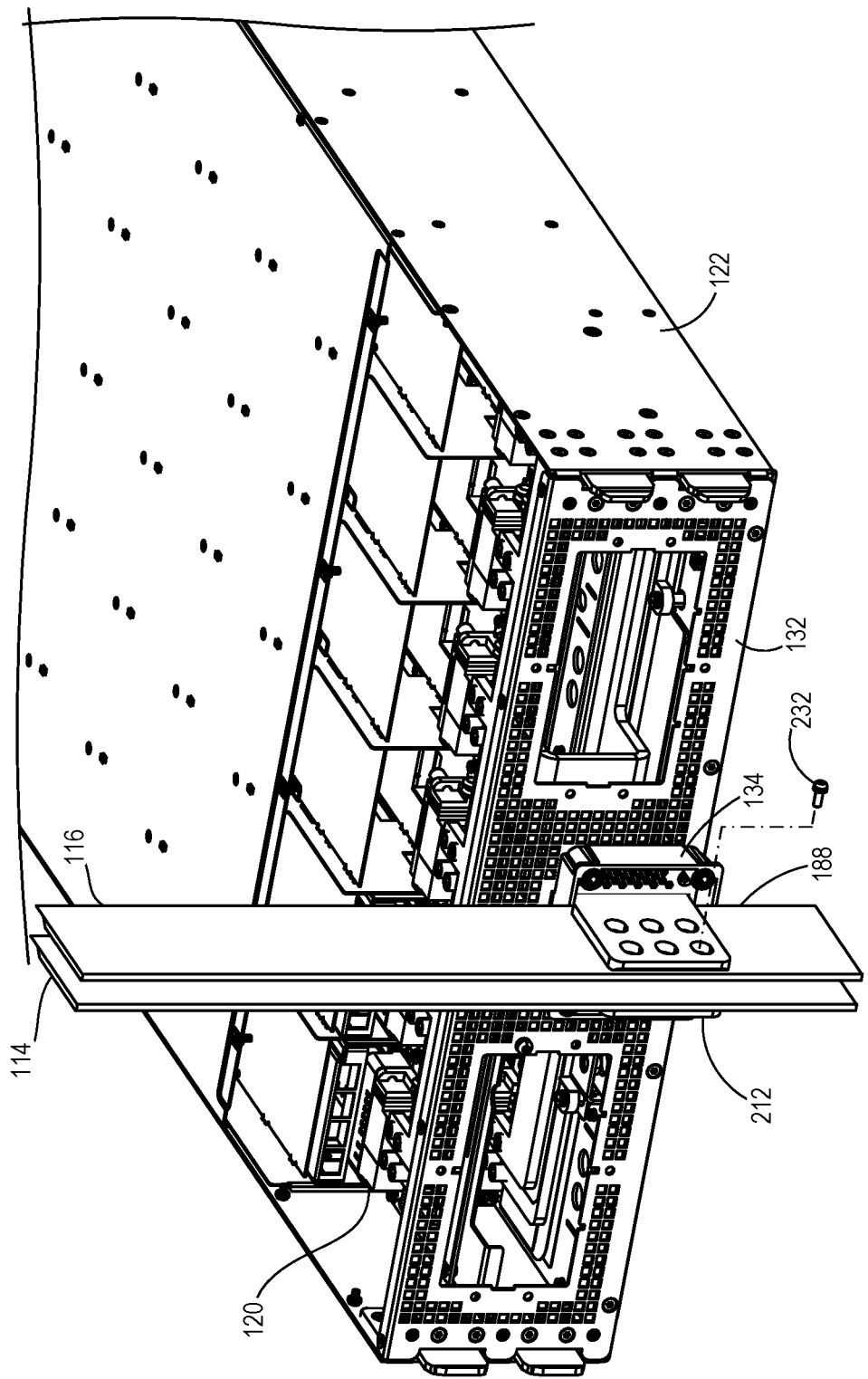

A bridge flange 186 extends between the top and bottom flanges 178, 180 in a manner that positions the top and bottom flanges 178, 180 spaced apart in an overlapping orientation as shown. The bridge flange 186 joins the top and bottom flanges 178, 180 to a system interface flange terminal 188 configured to electrically and mechanically couple the first bus bar 144 to the PDS 110 (as illustrated in FIG. 15). In a first orientation, the bridge flange 186 extends along a first vertical plane parallel with or substantially parallel with a vertical reference plane 190, and the top and bottom flanges 178, 180 extend along respective planes, each parallel with or substantially parallel with a horizontal reference plane 192. The system interface flange terminal 188 extends along a second vertical plane parallel with or substantially parallel with a vertical reference plane 194. Reference planes 190-194 are orthogonal with each other. As used herein, substantially parallel refers to an angular difference of 5 degrees or less (e.g., an angular in the range of −5 degrees to 5 degrees). Accordingly, a plane is substantially parallel with another plane if an absolute value of the angular difference between the normals of the planes is less than or equal to 5 degrees. Similarly, substantially orthogonal refers to an absolute value of the angular difference between the normals of the planes in the range of 85 degrees to 95 degrees.

Since the bus bar assembly 136 electrically couples the PDS 110 to the PSUs 120, in a scenario where the PDS 110 is designed to receive 15 kW of power from the PSUs 120, the bus bar assembly 136 is configured to transmit at least 15 kW of power to the PDS 110. One or more dimension parameters of each bus bar 144, 146 may be designed so that the bus bars 144, 146 are capable of passing the designed power requirements. For example, a thickness of the bus bars 144, 146 and/or the length or width dimensions of the various flanges (e.g., top flange, bottom flange, bridge flange, system interface flange terminal, etc.) of the bus bars 144, 146 may be altered to yield electrical characteristics sufficient to match at least the designed power. In an embodiment, bus bars 144, 146 are capable of transmitting 15 kW of power supplied by the PSUs 120 to the PDS 110.

Figure 7:
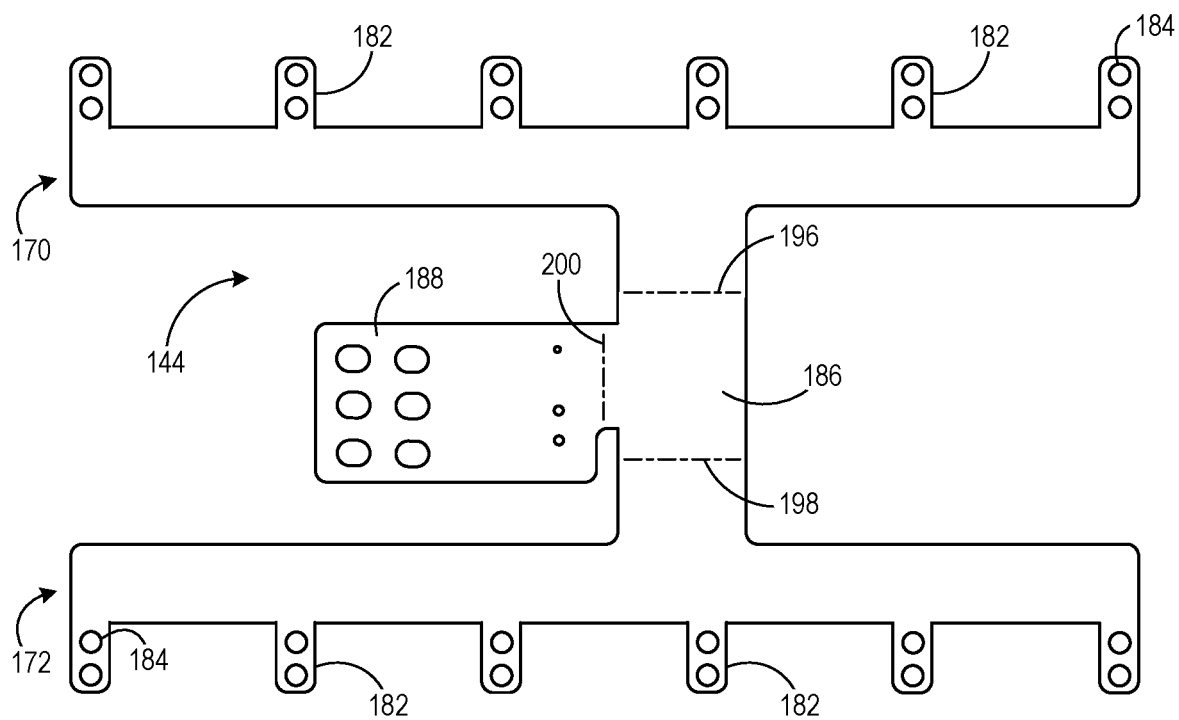
FIG. 7 illustrates a top plan view of the bus bar of FIG. 6 at a pre-finished stage of formation according to an embodiment.

FIG. 7 illustrates a top plan view of the first bus bar 144 at a pre-finished stage of formation according to an embodiment. The first bus bar 144 is formed of a single piece of metal or other electrically conductive material as described above. The shape of the outer perimeter of the first bus bar 144 may be stamped or punched out of a bulk material into the illustrated shape in one embodiment. In another embodiment, the perimeter of the first bus bar 144 may be cut out of a larger bulk material via milling, cutting, or other material removing process. Alternatively, a combination of punching and milling or cutting may be performed. The holes 184 in the tabs 182 may be formed via milling, cutting, drilling, or other hole-forming process known in the art. Other holes and/or vias in the first bus bar 144 may be formed using similar methods.

To form the overlapping layers 170, 172, the top flange 178 and bottom flange 180 may be bent about respective bend axes 196, 198 such that an angle at or about 90° (e.g., substantially orthogonal) is formed between the respective top and bottom flanges 178, 180 and the bridge flange 186. The top and bottom flanges 178, 180 extend away from a same side or surface of the bridge flange 186 and overlap as illustrated in FIG. 6. The system interface flange terminal 188 is further bent about a bend axis 200 in an opposite direction such that the flange terminal 188 extends away from an opposite side or surface of the bridge flange 186 at an angle of or about 90° (e.g., substantially orthogonal) with respect to the bridge flange 186. The steps for forming the bus bar 144 described herein may be performed in any order and are not limited to the order presented above. In addition, the sockets 162 and/or pins 160 to be installed in the holes 184 may be installed prior to, during, or after forming the bends in the first bus bar 144.

Figure 8:
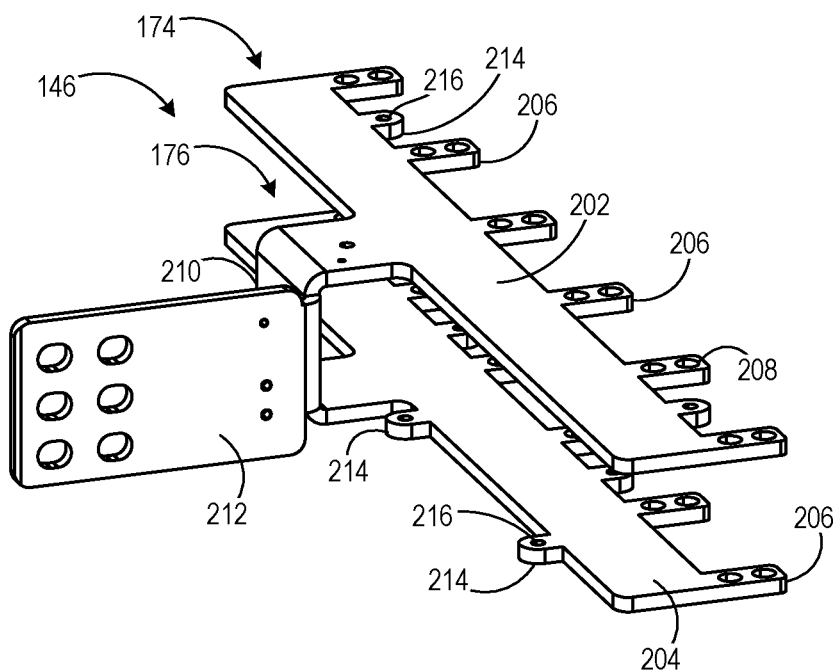
FIG. 8 illustrates an isometric view of a bus bar according to another embodiment.
Figure 9:
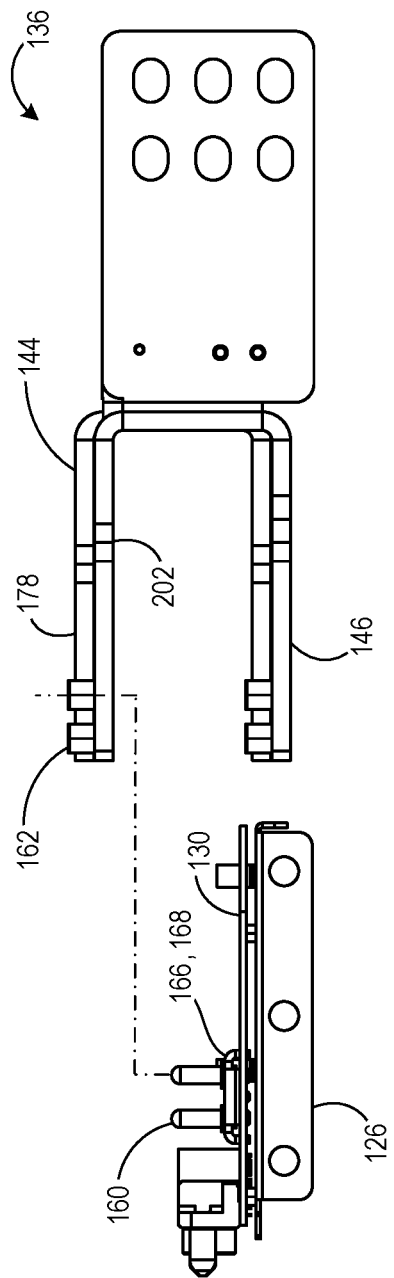

FIG. 8 illustrates an isometric view of the second bus bar 146 according to an embodiment. Similar to the first bus bar 144, the second bus bar 146 is preferably formed from a single piece of metal such as copper or other electrically conductive metal. The layer 174 of the second bus bar 146 is formed from a top flange 202, and the layer 176 is formed from a bottom flange 204. A plurality of tabs 206 extends from the top and bottom flanges 202, 204. Each tab 206 has a pair of holes or apertures 208 formed therein. A bridge flange 210 extends between the top and bottom overlapping flanges 202, 204. The bridge flange 210 joins the top and bottom flanges 202, 204 to a system interface flange terminal 212 configured to electrically and mechanically couple the second bus bar 146 to the PDS 110 (as illustrated in FIG. 15). The attributes of the elements of the first bus bar 144 described above further apply to the second bus bar 146.

Figure 10:
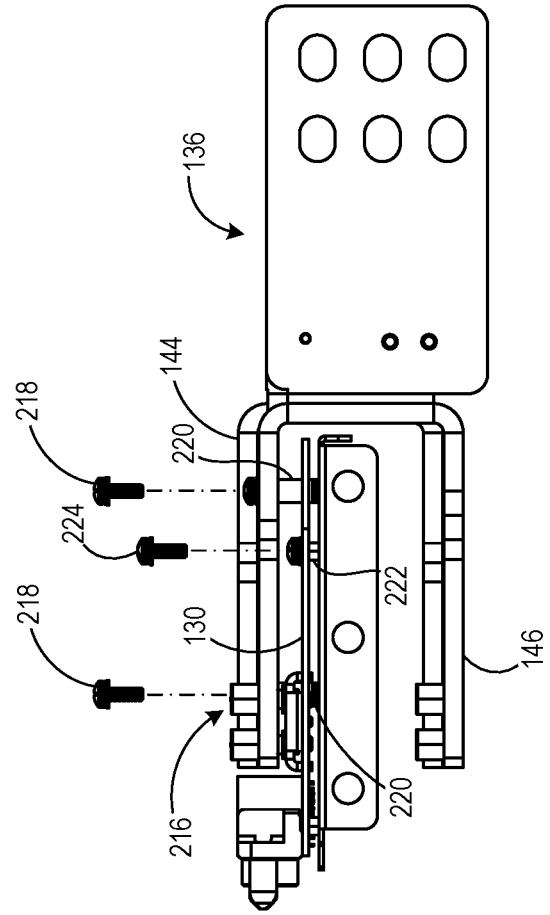

In addition to the tabs 206 that extend from the top and bottom flanges 202, 204, one or more mounting projections 214 extend from the top and bottom flanges 202, 204 with mounting holes 216 formed therein to allow the second bus bar 146 and thus the entire bus bar assembly 136 to be securely fastened to the PCBs 128, 130 and/or to one or more members of the chassis 122 (e.g., second bracket 126) as described with respect to FIG. 10.

After both bus bars 144, 146 are formed, they may be joined together with the insulation layers 148, 150 as illustrated in FIG. 4 to form the complete, unitary bus bar assembly 136 illustrated throughout this disclosure. The rigid, unitary structure of the bus bar assembly 136 facilitates manufacture of the power shelf 118 as illustrated below. Embodiments of the disclosure also contemplate that separate handling procedures may be performed to separately join each bus bar 144, 146 individually with the respective PCBs 130, 128. However, such separate handling can increase costs and time associated with installing the bus bars 144, 146 within the power shelf 118.

FIGS. 9-15 illustrate steps for installing the bus bar assembly 136 and PCBs 128, 130 into the chassis 122 (FIG. 2) according to embodiments. In a first installation step, the top PCB 130 is coupled with the top flanges 178, 202 of the first and second bus bars 144, 146. In this step, the pins 160 of the first pin assemblies 166 are inserted into the sockets 162 of the top flange 178 of the first bus bar 144, and the pins 160 of the second pin assemblies 168 are inserted into the sockets 162 of the top flange 202 of the second bus bar 146. The second bracket 126 may be pre-fastened to the PCB 130 so that both are coupled to the bus bar assembly 136 at the same time in one embodiment. In another embodiment, the PCB 130 and the second bracket 126 may be separately brought near the top flanges 178, 202 for fastening both to the bus bar assembly 136.

Figure 11:
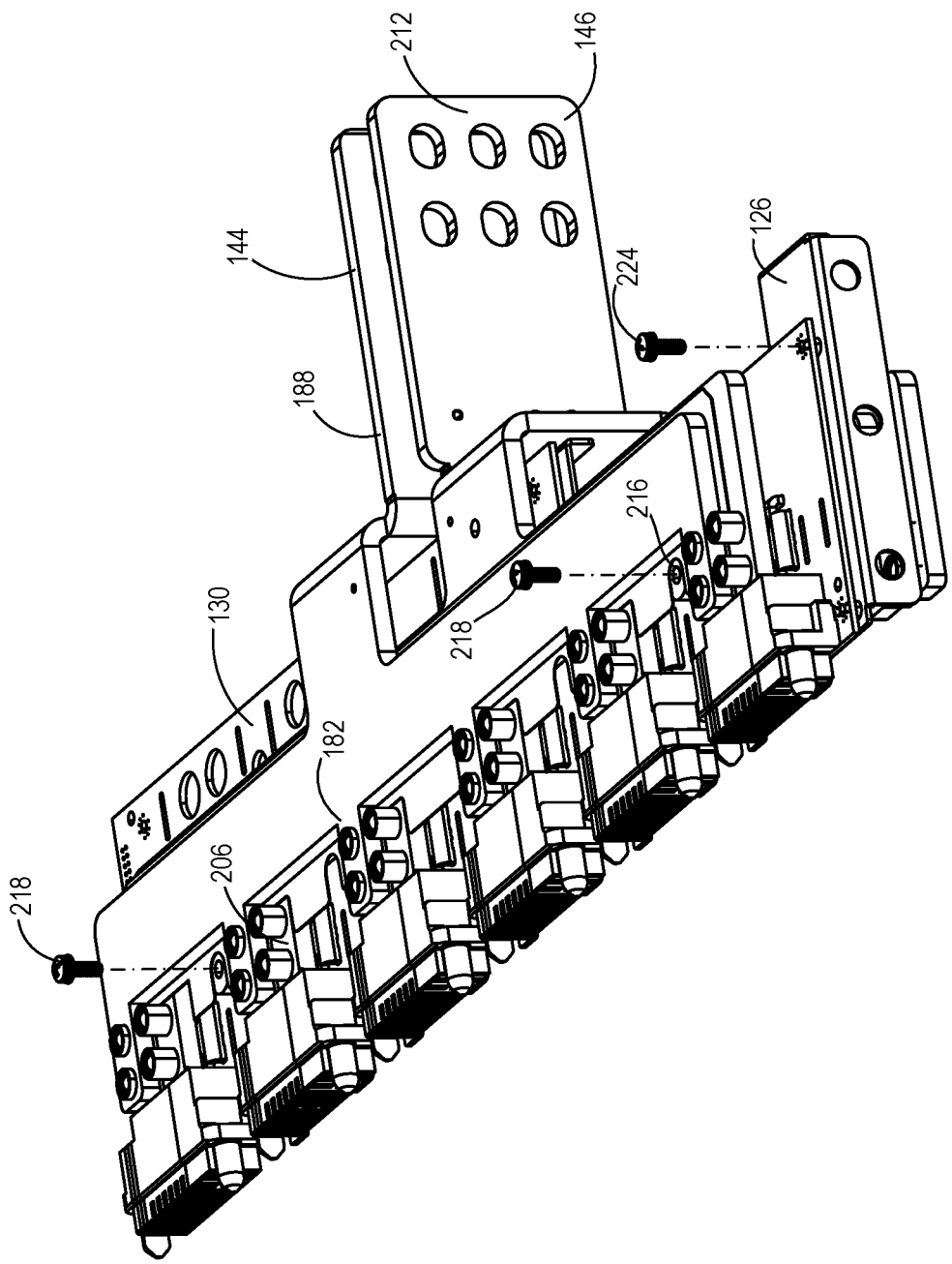

FIGS. 10 and 11 illustrate inserting fasteners 218 such as screws or bolts through the mounting holes 216 of the second bus bar 146. The fasteners 218 extend through standoffs 220 and may be inserted into the installation holes 138 of the second bracket 126, which may be threaded to receive threaded fasteners 218. Alternatively, threaded fasteners 218 may be secured into threaded mating fasteners (e.g., nuts) beyond the second bracket 126. In other embodiments, the fasteners 218 may include press-fit fasteners, rivets, and the like. In one embodiment, the fasteners 218 electrically connect the second bus bar 146 to the second bracket 126 and to the chassis 122 so that a ground of the PCB 130 and the grounds of any of the PSUs 120 electrically coupled to the PCB 130 are connected to the chassis 122. In another embodiment, the fasteners 218 avoid electrically connecting the second bus bar 146 to the second bracket 126.

The fasteners 218 and standoffs 220 may mechanically couple both the PCB 130 and the second bracket 126 to the bus bar assembly 136. A standoff 222 between the PCB 130 and the second bracket 126 and one or more fasteners 224 may further secure the PCB 130 to the second bracket 126. The fastener 224 may be electrically insulated from the PCB 130 to avoid an electrical connection to the chassis 122 via the fastener 224. Alternatively, the fastener 224 may electrically connect a ground of the PCB 130 to the second bracket 126 and chassis 122.

As illustrated in FIG. 11, the tabs 182 of the first bus bar 144 and the tabs 206 of the second bus bar 146 are offset to allow the respective sockets 162 coupled thereto to couple with the adjacent first and second pin assemblies 166, 168. Accordingly, the tabs 182 of the first bus bar 144 do not overlap the tabs 206 of the second bus bar 146. Further, the system interface flange terminal 188 of the first bus bar 144 extends from the left side of the bridge flange 186 when viewed from a rear of the first bus bar 144 while the system interface flange terminal 212 of the second bus bar 146 extends from the right side of the bridge flange 210 when viewed from a rear of the second bus bar 146. This opposite arrangement creates a gap between the system interface flange terminals 188, 212 that allows them to couple with a narrowly spaced power rails 114, 116 of the PDS 110.

FIG. 12 illustrates the second or lower PCB 128 installed within the chassis 122 according to an embodiment. The PCB 128 may be mechanically connected to the chassis 122 in a similar manner as the PCB 130 is to the second bracket 126. A partition assembly 226 positioned within the chassis 122 provides supporting walls 228 and openings 230 for the PSUs 120 (not shown in FIG. 12) installed in the power shelf 118. As illustrated, each PSU mating receptacle connector 164 of the PCB 128 is aligned with a respective support opening 230. In this manner, the electrical connector header 142 of the PSU 120, being guided by the support walls 228 and openings 230, is aligned with a respective PSU mating receptacle connector 164 and is electrically coupled thereto when the PSU 120 is seated into its installation position within the partition assembly 226 (see FIG. 2).

Referring to FIGS. 13 and 14, the bus bar assembly 136 with the PCB 130 and second bracket 126 attached thereto as illustrated in FIGS. 10 and 11 is brought near the PCB 128 and chassis 122 assembly of FIG. 12, and the pins 160 of the first pin assemblies 166 are inserted into the sockets 162 of the bottom flange 180 of the first bus bar 144 while the pins 160 of the second pin assemblies 168 are inserted into the sockets 162 of the bottom flange 204 of the second bus bar 146. The bottom flange 204 of the second bus bar 146 is fastened to the standoffs 220 coupled to the chassis 122, and additional fasteners 224 may be used to further couple the PCB 128 to the standoffs 222. The installation holes 140 of the second bracket 126 may be used to securely fasten the second bracket 126 to the chassis 122 via fasteners such as fasteners 218, 224. As illustrated in FIG. 14, the PSU mating receptacle connectors 164 of the PCB 130 are aligned with the support openings 230 of the partition assembly 226 such that respective PSU mating receptacle connectors 164 are electrically coupled thereto when PSUs 120 are seated into installation positions within the partition assembly 226 (see FIG. 2).

As illustrated in FIG. 15, the bus bar protective cover 134 is coupled to the rear plate 132, and the rear plate 132 is coupled to the chassis 122 such that the system interface flange terminals 188, 212 extend therethrough. As further illustrated, the assembly method illustrated in FIGS. 9-15 allow the system interface flange terminals 188, 212 to be respectively coupled to the power rails 116, 114. In this manner, PSUs 120 coupled to the bus bar assembly 136 are electrically coupled to the rack bus system 112 of the PDS 110. The system interface flange terminals 188, 212 are electrically coupled to the power rails 116, 114 via fasteners 232. While the power rails 114, 116 are illustrated as being positioned within the gap between the system interface flange terminals 188, 212, embodiments are not so limited. That is, the power rails 114, 116 may be positioned on either side of the system interface flange terminals 188, 212.

Embodiments of the disclosure provide a bus bar assembly for a multi-row power shelf of an equipment rack. The bus bar assembly electrically couples power supply units of the multiple rows of the power shelf together and to a power distribution system of the equipment rack. A pair of bus bars in the bus bar assembly electrically couple respective voltage busses of the power supply units to respective rails of the power distribution system. The bus bar assembly presents a unitary assembly for installation into the power shelf that reduces labor time and costs associated with the installation process of the power shelf. In addition, using pins and sockets as described herein can reduce failures associated with threaded fasteners loosening over time. When constructed of a single piece of metal, each bus bar reduces electrical losses that can occur with one or more fastener-type contact joints (e.g., lap joints, butt joints, etc.) electrically coupling separate bus bar members. A single connection point of the bus bars via a system interface flange terminal for delivery of combined output power of the PSUs of the power shelf further simplifies installation of the power shelf into the equipment rack.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the invention is not to be seen as limited by the foregoing description but is only limited by the scope of the appended claims.

What is claimed is:

1. A bus bar assembly capable of use with an equipment rack power shelf, the bus bar assembly comprising:
   a first bus bar and a second bus bar, each of the first bus bar and the second bus bar respectively comprising:
      a bridge flange having a first side and a second side opposite the first side;
      a top flange extending from the first side of the bridge flange and comprising a first plurality of mating devices coupled thereto;
      a bottom flange extending from the first side of the bridge flange and comprising a second plurality of mating devices coupled thereto; and
      an interface flange extending from the second side of the bridge flange;
   a first insulation layer positioned between the top flange of the first bus bar and the top flange of the second bus bar; and
   a second insulation layer positioned between the bottom flange of the first bus bar and the bottom flange of the second bus bar;
   wherein the top flange of the first bus bar, the top flange of the second bus bar, and the first insulation layer are fixedly joined together;
   wherein the bottom flange of the first bus bar, the bottom flange of the second bus bar, and the second insulation layer are fixedly joined together; and
   wherein each of the first and second bus bars comprises a single piece of electrically conductive metal;
   wherein the top flanges of the first and second bus bars are substantially parallel with the respective bottom flanges of the first and second bus bars and are substantially orthogonal with the respective bridge flanges of the first and second bus bars; and
   wherein the interface flanges of the first and second bus bar are substantially orthogonal with the respective bridge flanges of the first and second bus bars and substantially orthogonal with the respective top flanges of the first and second bus bars.

2. The bus bar assembly of claim 1, wherein each of the top and bottom flanges of each of the first and second bus bars comprises a plurality of tabs extending from a first side thereof.

3. The bus bar assembly of claim 2 further comprises at least one electrical connector electrically coupled with each tab of the pluralities of tabs, wherein the at least one electrical connector is configured to mate with a corresponding electrical connector coupled to a printed circuit board of the equipment rack power shelf.

4. The bus bar assembly of claim 3, wherein the at least one electrical connector comprises a socket connector configured to mate with a corresponding pin connector.

5. The bus bar assembly of claim 4, each tab of the pluralities of tabs has a hole formed therein for each socket connector electrically coupled therewith, wherein each socket connector is installed within a corresponding hole.

6. The bus bar assembly of claim 2, wherein the tabs of the plurality of tabs of the first bus bar are offset from the tabs of the plurality of tabs of the second bus bar.

7. The bus bar assembly of claim 1, wherein the respective bridge flange, top flange, bottom flange, and interface flange of each of the first and second bus bars are coupled together without a fastener.

8. A power shelf for an equipment rack, the power shelf comprising:
a chassis;
a plurality of power supply units (PSUs) comprising:
a first PSU positioned within a first row of the chassis; and
a second PSU positioned within a second row of the chassis;
a first printed circuit board (PCB) coupled to the first PSU;
a second PCB coupled to the second PSU;
a bus bar assembly comprising:
a first bus bar formed from a single piece of metal and comprising:
a first bridge flange;
a first flange extending from a first side of the first bridge flange;
a second flange extending from the first side of the first bridge flange; and
a first system interface flange extending from a second side of the first bridge flange;
a second bus bar formed from a single piece of metal and comprising:
a second bridge flange;
a third flange extending from a first side of the second bridge flange;
a fourth flange extending from the first side of the second bridge flange; and
a second system interface flange extending from a second side of the second bridge flange;
a first insulation layer fixedly joined between the first flange and the third flange; and
a second insulation layer fixedly joined between the second flange and the fourth flange;
a first plurality of electrical connectors coupled to the first and second flanges;
a second plurality of electrical connectors coupled to the first PCB;
a third plurality of electrical connectors coupled to the third and fourth flanges; and
a fourth plurality of electrical connectors coupled to the second PCB;
wherein the first and third flanges are electrically and mechanically coupled to the first PCB;
wherein the second and fourth flanges are electrically and mechanically coupled to the second PCB;
wherein electrical connectors of the first plurality of electrical connectors are configured to mate with the electrical connectors of the second plurality of electrical connectors; and
wherein electrical connectors of the third plurality of electrical connectors are configured to mate with the electrical connectors of the fourth plurality of electrical connectors.

9. The power shelf of claim 8, wherein the first insulation layer, the first flange, and the third flange are adhesively joined together; and
wherein the second insulation layer, the second flange, and the fourth flange are adhesively joined together.

10. The power shelf of claim 8, wherein the electrical connectors of the first and third pluralities of electrical connectors comprise socket connectors; and
wherein the electrical connectors of the second and fourth pluralities of electrical connectors comprise pin connectors.

11. The power shelf of claim 8, wherein the third and fourth flanges comprise one or more mounting projections respectively extending therefrom; and
further comprising a fastener extending through each mounting projection to fasten the bus bar assembly to the first and second PCBs.

12. The power shelf of claim 8, wherein the first flange, the second flange, the third flange, and the fourth flange are substantially parallel with each other;
wherein the first flange, the second flange, the third flange, and the fourth flange are substantially orthogonal with the first and second bridge flanges; and
wherein the first and second bridge flanges are substantially orthogonal with the first and second system interface flanges.

13. The power shelf of claim 8, wherein each of the first and second system interface flanges is configured to be electrically and mechanically coupled with a respective power rail of the equipment rack.

14. The power shelf of claim 8, wherein the first bridge flange, the first flange, the second flange, and the first system interface flange are coupled together without a fastener; and
wherein the second bridge flange, the third flange, the fourth flange, and the second system interface flange are coupled together without a fastener.

15. The power shelf of claim 8, wherein each of the first and second bus bars is configured to transmit 15 kW of power supplied by the plurality of PSUs.

* * * * *